US011456341B2

United States Patent
Li

(10) Patent No.: US 11,456,341 B2
(45) Date of Patent: Sep. 27, 2022

(54) DISPLAY SCREEN, MANUFACTURING METHOD THEREOF, AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventor: Yuanhang Li, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 191 days.

(21) Appl. No.: 16/954,662

(22) PCT Filed: Apr. 28, 2020

(86) PCT No.: PCT/CN2020/087516
§ 371 (c)(1),
(2) Date: Jun. 17, 2020

(87) PCT Pub. No.: WO2021/159612
PCT Pub. Date: Aug. 19, 2021

(65) Prior Publication Data
US 2021/0343797 A1 Nov. 4, 2021

(30) Foreign Application Priority Data

Feb. 10, 2020 (CN) .......................... 202010084066.9

(51) Int. Cl.
H01L 27/32 (2006.01)
H01L 51/52 (2006.01)

(52) U.S. Cl.
CPC .......... H01L 27/323 (2013.01); H01L 27/322 (2013.01); H01L 27/3246 (2013.01); H01L 51/5206 (2013.01); H01L 51/5221 (2013.01); H01L 51/5284 (2013.01)

(58) Field of Classification Search
CPC ..................................................... H01L 27/323
See application file for complete search history.

(56) References Cited

U.S. PATENT DOCUMENTS

| 2016/0026311 A1 | 1/2016 | Wang |
| 2018/0157082 A1 | 6/2018 | Wang |
| 2019/0187844 A1 | 6/2019 | Ye |

(Continued)

FOREIGN PATENT DOCUMENTS

| CN | 103995634 A | 8/2014 |
| CN | 105159514 A | 12/2015 |

(Continued)

*Primary Examiner* — Yu-Hsi D Sun

(57) ABSTRACT

A display screen, a manufacturing method thereof, and an electronic device are provided. The display screen includes a cathode disposed on an organic light-emitting layer and a pixel definition layer and multiplexed as a first touch control electrode; a second touch control electrode disposed on the cathode; and a plurality of black matrices disposed on the second touch control electrode. Positions of the black matrices correspond to positions of second touch control units.

19 Claims, 2 Drawing Sheets

(56) References Cited

U.S. PATENT DOCUMENTS

| | | | |
|---|---|---|---|
| 2021/0200363 A1* | 7/2021 | Lee | H01L 27/323 |
| 2021/0242283 A1* | 8/2021 | Lee | G06F 3/0412 |
| 2022/0005891 A1* | 1/2022 | Shu | H01L 27/323 |
| 2022/0059805 A1* | 2/2022 | Cho | H01L 51/5284 |

FOREIGN PATENT DOCUMENTS

| | | |
|---|---|---|
| CN | 107275512 A | 10/2017 |
| CN | 107844219 A | 3/2018 |
| CN | 107870697 A | 4/2018 |
| CN | 109119453 A | 1/2019 |
| CN | 109407870 A | 3/2019 |
| CN | 109671744 A | 4/2019 |
| CN | 110518151 A | 11/2019 |

* cited by examiner

DISPLAY SCREEN, MANUFACTURING METHOD THEREOF, AND ELECTRONIC DEVICE

FIELD OF INVENTION

The present disclosure relates to the field of display technologies, and more particularly, to a display screen, a manufacturing method thereof, and an electronic device.

BACKGROUND OF INVENTION

Current display screens include a display panel and a touch layer. A polarizer is usually disposed at a topmost of the display screens, and the display panel usually adopts an organic light-emitting diode display panel. Although the polarizer (POL) can effectively minimize reflections under strong light, nearly 58% of light emitted will be lost, thereby increasing a burden of organic light-emitting diodes, that is, increasing power consumption. In addition, the polarizer has a greater thickness (close to 100 μm) and material thereof is brittle, making it unsuitable for use on a flexible display screen.

A technique of using a color filter to replace the polarizer (POL) has shown up thereafter, that is, manufacturing the color filter on the touch layer. It can not only reduce a thickness of a functional layer from 100 μm to below 5 μm, but can also increase light extraction efficiency from 42% to 60%. Therefore, this technique is considered to be one of key technologies for development of achieving dynamic bending products.

Since current touch control electrode is disposed on the color filter, that is, the touch control electrode is under black matrices, and the color filter after spin coating or inkjet printing still has a higher reflection to OLED self-illumination and ambient light due to its own nature, reflections of light cannot be effectively reduced, thereby reducing display effect.

Therefore, it is necessary to provide a display screen, a manufacturing method thereof, and an electronic device to solve the problem in current technology.

SUMMARY OF INVENTION

An objective of the present disclosure is to provide a display screen, a manufacturing method thereof, and an electronic device to effectively reduce reflections of light, thereby improving display effect.

To solve the above problem, an embodiment of the present disclosure provides a display screen. The display screen comprises:

a flexible substrate;
a switch array layer disposed on the flexible substrate;
an anode disposed on the switch array layer;
a pixel definition layer disposed on the anode and comprising a plurality of opening areas;
an organic light-emitting layer positioned in the opening areas;
a cathode disposed on the organic light-emitting layer and the pixel definition layer, wherein the cathode is multiplexed as a first touch control electrode comprising a plurality of first touch control units;
a second touch control electrode disposed on the cathode and comprising a plurality of second touch control units disposed at intervals; and
a plurality of black matrices disposed on the second touch control electrode, wherein positions of the black matrices correspond to positions of the second touch control units.

The present disclosure further provides an electronic device including the above display screen.

The present disclosure further provides a manufacturing method of a display screen. The method includes following steps:

manufacturing a switch array layer on a flexible substrate;
manufacturing an anode, a pixel definition layer, an organic light-emitting layer, and a cathode on the switch array layer in sequence, and patterning the cathode to form a first touch control electrode;
manufacturing a first inorganic layer, a color resist layer, an organic layer, and a second inorganic layer on the cathode in sequence; and
manufacturing a conductive layer on the second inorganic layer, manufacturing a black matrix layer on the conductive layer, patterning the black matrix layer to form a plurality of black matrices, and using the black matrices to etch the conductive layer to retain the conductive layer having a position corresponding to the black matrices to obtain a second touch control electrode.

The display screen, the manufacturing method thereof, and the electronic device of the present disclosure include: a flexible substrate; a switch array layer disposed on the flexible substrate; an anode disposed on the switch array layer; a pixel definition layer disposed on the anode and comprising a plurality of opening areas; an organic light-emitting layer positioned in the opening areas; a cathode disposed on the organic light-emitting layer and the pixel definition layer, wherein the cathode is multiplexed as a first touch control electrode comprising a plurality of first touch control units; a second touch control electrode disposed on the cathode and comprising a plurality of second touch control units disposed at intervals; and a plurality of black matrices disposed on the second touch control electrode, wherein positions of the black matrices correspond to positions of the second touch control units. Since the black matrices correspond to the positions of the second touch control units, reflections to ambient light and reflections of metal electrodes to light can be effectively reduced, thereby improving the display effect.

DETAILED DESCRIPTION OF PREFERRED EMBODIMENTS

Figure 1:
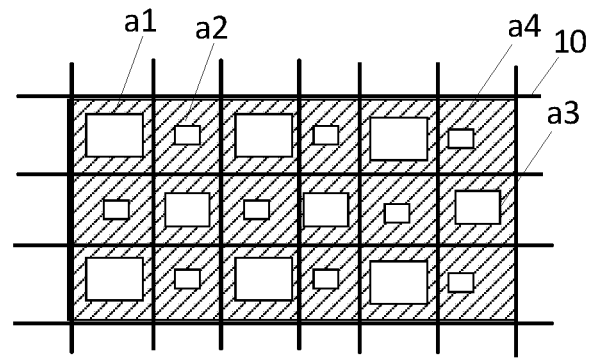
FIG. 1 is a schematic top view of a touch layer and a color filter of a display screen in current technology.

The specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. Therefore, the directional terms used are to illustrate and understand the present disclosure, not to limit the present disclosure. The identical or similar reference numerals constantly denote the identical or similar elements or elements having the identical or similar functions in the drawings.

A current display screen includes a touch layer and a color filter disposed on the touch layer. The touch layer includes a first touch control electrode, an insulating layer, a second touch control electrode, and a first transparent organic photoresist layer. As shown in FIG. 1, 10 denotes a touch control electrode, and a structure of the color filter includes red color filter resists a1, green color filter resists a2, blue color filter resists a3, black matrices a4, and a second transparent organic photoresist layer (a planarization layer). Wherein, in a manufacturing process, the current display screen requires 9 photolithography processes.

Figure 2:
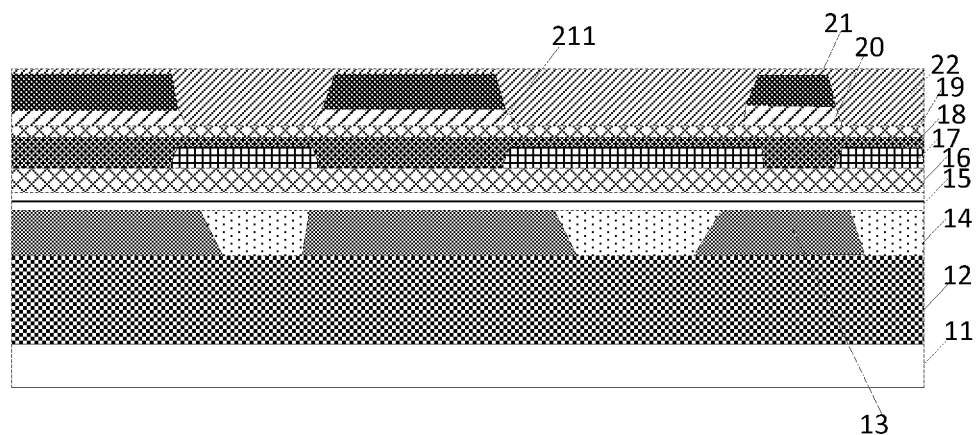
FIG. 2 is a schematic structural diagram of a display screen according to an embodiment of the present disclosure.
Figure 3:
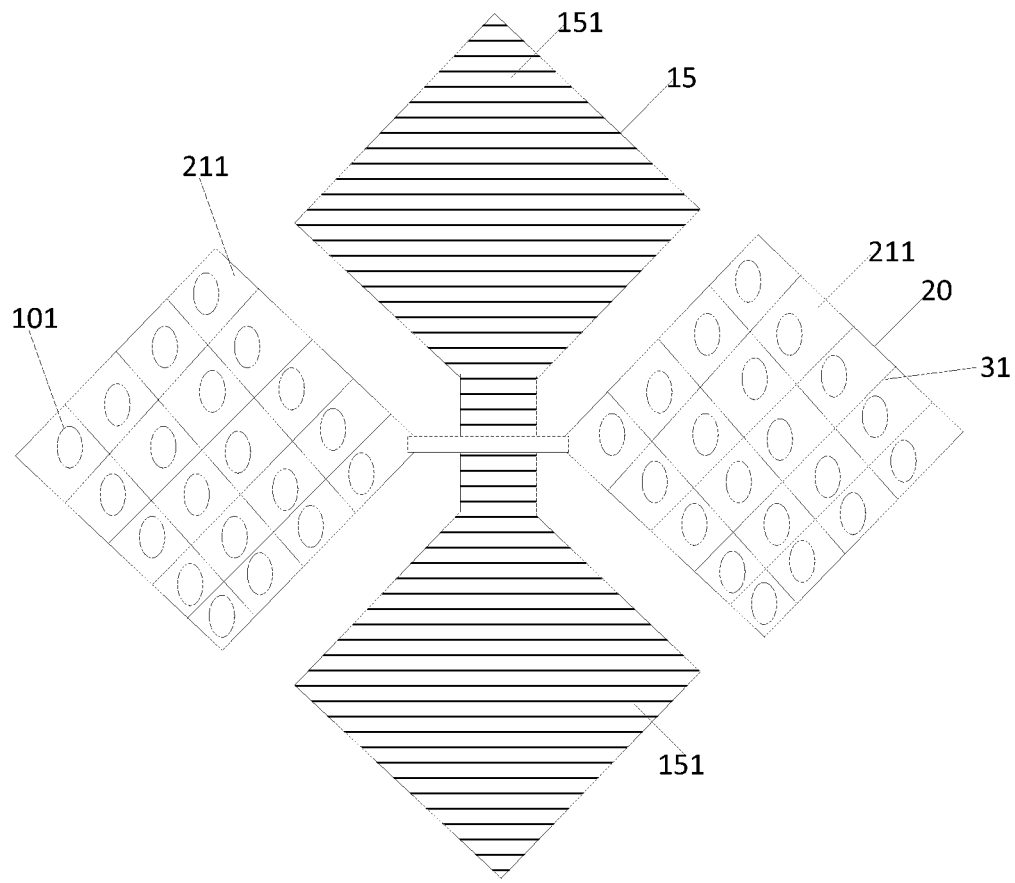
FIG. 3 is a schematic top view of a cathode and a second touch control electrode according to an embodiment of the present disclosure.
Figure 4:
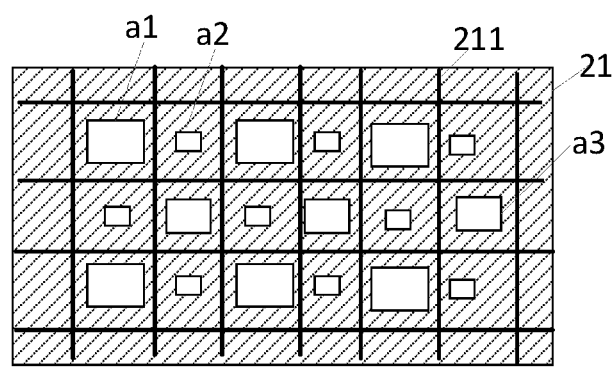
FIG. 4 is a schematic top view of a touch layer and a color filter of a display screen according to an embodiment of the present disclosure.

Please refer to FIGS. 2 to 4, FIG. 2 is a schematic structural diagram of a display screen according to an embodiment of the present disclosure.

As shown in FIG. 2, a display screen of the present disclosure includes a flexible substrate 11, a switch array layer 12, an anode (not shown in the figure), a pixel definition layer 13, an organic light-emitting layer 14, a cathode 15, a second touch control electrode 20, and black matrices 21.

Wherein, a material for the flexible substrate 11 may be polyimide.

The switch array layer 12 is disposed on the flexible substrate 11 and may include a plurality of switch elements, and a cross-sectional structure thereof includes a gate electrode, an active layer, a source electrode, and a drain electrode. The switch elements are, for example, thin film transistors.

The anode is disposed on the switch array layer 12.

The pixel definition layer 13 includes a plurality of opening areas (not indicated in the figure), and the organic light-emitting layer 14 is disposed in the opening areas.

The cathode 15 is disposed on the organic light-emitting layer 14 and the pixel definition layer 13.

Combined with FIG. 3, the cathode 15 is multiplexed as a first touch control electrode which includes a plurality of first touch control units 151, and the first touch control units 151 correspond to a plurality of organic light-emitting units of the display screen. Two adjacent first touch control units 151 are electrically connected. The cathode 15 may be manufactured by a low temperature process, wherein, a process temperature is less than 90 degrees.

Returning to FIG. 2, in an embodiment of the present disclosure, the display screen further includes a color resist layer 17 disposed between the cathode 15 and the second touch control electrode 20. In an embodiment of the present disclosure, the display screen may also include an encapsulation layer, and the color resist layer 17 may be disposed in the encapsulation layer. In an embodiment of the present disclosure, a cross-sectional structure of the encapsulation layer may include a first inorganic layer 16, an organic layer 18, and a second inorganic layer 19.

A thickness of the first inorganic layer 16 may range from 1 μm to 2 μm.

The color resist layer 17 is disposed on the first inorganic layer 16. The color resist layer 17 includes a plurality of color filter resists, such as red color filter resists, green color filter resists, and blue color filter resists, and positions of the color filter resists correspond to positions of the organic light-emitting units. Specifically, the red color filter resists correspond to red organic light-emitting units, and color filter resists of other colors are similar to this. In an embodiment of the present disclosure, the color resist layer 17 is manufactured by inkjet printing. Since the color resist layer is manufactured by inkjet printing, that is, a same process for manufacturing the organic layer, use of photolithography can be prevented in manufacturing the color filter resists, thereby simplifying the process and improving production efficiency.

The organic layer 18 is disposed on the color resist layer 17. The organic layer 18 is also manufactured by inkjet printing, and a thickness thereof ranges from 8 μm to 10 μm.

The second inorganic layer 19 is disposed on the organic layer 18. A thickness range of the second inorganic layer 19 may be the same as the first inorganic layer 16. Materials of the second inorganic layer 19 and the first inorganic layer 16 may both be SiNx/SiOx.

The second touch control electrode 20 is disposed on a part of the encapsulation layer. That is, the second touch control electrode 20 is disposed on a part of the second inorganic layer 19. Combined with FIG. 3, wherein, the second touch control electrode 20 includes a plurality of second touch control units 211 disposed at intervals, and a shape of the second touch control units 211 is a grid shape. Wherein, under a top viewing angle, the display screen includes a plurality of organic light-emitting units 101, and the second touch control units include a plurality of touch control sensing lines 31. The touch control sensing lines 31 correspond to positions of gaps between two adjacent organic light-emitting units 101. That is, the touch control sensing lines 31 are positioned in the gaps between the two adjacent organic light-emitting units 101. Wherein, the first touch control units 151 and the second touch control units 211 are disposed alternatingly. A material of the second touch control electrode 20 may be a metal material or a transparent conductive material. The material of the second touch control electrode 20 may be Ti/Al/Ti or Mo, or may be a conductive material having a high transmittance such as indium tin oxide (ITO), graphene, and AgNW.

Returning to FIG. 2, the black matrices 21 are disposed on the second touch control electrode 20. Wherein, positions of the black matrices 21 correspond to positions of the second touch control units 211. Combined with FIG. 4, since the black matrices 21 are disposed on the second touch control electrode 20 and correspond to the positions of the second touch control units 211, the black matrices 21 can completely shield the second touch control units 211, thereby reducing reflections to ambient light and reflections of metal electrodes to light and improving the display effect. In addition, a combination of the black matrices and the color filter resists a1 to a3 can shield the first touch control units, thereby further reducing the reflections to the ambient light and the reflections of the metal electrodes to the light.

In addition, the display screen may also include a planarization layer 22 and a glass cover (not shown in the figure). A material for the planarization layer 22 may be a transparent photoresist material.

During a specific working process of the display screen: when the display screen is at a display stage, the cathode 15 has a first function, that is, the cathode 15 cooperates with the anode to drive the organic light-emitting units to illuminate.

When the display screen is at a touch stage, the cathode 15 has a second function. That is, the cathode 15 is used as a first touch control electrode to cooperate with the second touch control electrode 20 to detect touch control signals. At this time, the cathode 15 and the second touch control electrode 20 form a mutual capacitance mode touch layer.

Wherein, the display screen further includes a plurality of connecting lines and a driver chip (not shown in the figure). The first touch control units 151 are connected to the driver chip through the connecting lines, that is, every first touch control unit 151 corresponds to one connecting line. The driver chip is used for providing driving voltages at the display stage and detecting the touch control signals at the touch stage. That is, the driver chip has functions of driving to display and controlling touch control.

Since the cathode is also used as the first touch control electrode, that is, multiplexing the patterned cathode as the first touch control electrode, one manufacturing process for a touch control electrode can be reduced, thereby improving the production efficiency.

In an embodiment of the present disclosure, combined with FIGS. 2 and 3, a manufacturing method of the above display screen includes following steps:

S101: manufacturing the switch array layer 12 on the flexible substrate 11.

S102: manufacturing the anode, the pixel definition layer 13, the organic light-emitting layer 14, and the cathode 15 on the switch array layer 12 in sequence, and patterning the cathode 15 to form the first touch control electrode.

Wherein, the pixel definition layer 13 is provided with the plurality of opening areas, and the organic light-emitting layer 14 is disposed in the opening areas.

S103: manufacturing the first inorganic layer 16, the color resist layer 17, the organic layer 18, and the second inorganic layer 19 on the cathode 15 in sequence.

Wherein, the color resist layer 17 includes the plurality of color filter resists, and the positions of the color filter resists correspond to the positions of the organic light-emitting units.

S104: manufacturing a conductive layer on the second inorganic layer 19, manufacturing a black matrix layer on the conductive layer, patterning the black matrix layer to form the plurality of black matrices 21, and using the black matrices 21 to etch the conductive layer to retain the conductive layer having a position corresponding to the black matrices 21 to obtain the second touch control electrode 20.

In the etching process, the conductive layer not covered with the black matrices 21 are etched. After the etching, the conductive layer having the position corresponding to the black matrices 21 forms the second touch control electrode 20. A material of the conductive layer may be Ti/Al/Ti or Mo, or may be a conductive material having a high transmittance such as indium tin oxide (ITO), graphene, and AgNW.

The above method may also include manufacturing the planarization layer 22 and the glass cover on the black matrix layer.

Current technology uses a transparent organic photoresist material to pattern the second touch control electrode, while the present disclosure directly uses the black matrices to replace the transparent organic photoresist material for patterning, which can not only omit a process for manufacturing the black matrices, but can also save the transparent organic photoresist material, and it is not necessary to strip off the black matrices after patterning the conductive layer, thereby simplifying the manufacturing process and reduce the production cost. Secondly, compared to current technology, the manufacturing method of the present disclosure can omit photolithography processes (masking processes) of a first touch control electrode, an insulating layer, a first transparent organic photoresist layer, black matrices, red color filter resists, green color filter resists, and blue color filter resists in current structure. The present disclosure only needs to use the photolithography processes when manufacturing the second touch control electrode and the planarization layer, thereby simplifying the manufacturing process and improving process efficiency. Meanwhile, an investment of production lines for the photolithography processes is reduced, thereby reducing the production cost.

The present disclosure further provides an electronic device, which comprises any one of the above display screens. The electronic device may be devices such as mobile phones, tablets, and computers.

The display screen, the manufacturing method thereof, and the electronic device of the present disclosure include: a flexible substrate; a switch array layer disposed on the flexible substrate; an anode disposed on the switch array layer; a pixel definition layer disposed on the anode and comprising a plurality of opening areas; an organic light-emitting layer positioned in the opening areas; a cathode disposed on the organic light-emitting layer and the pixel definition layer, wherein the cathode is multiplexed as a first touch control electrode comprising a plurality of first touch control units; a second touch control electrode disposed on the cathode and comprising a plurality of second touch control units disposed at intervals; and a plurality of black matrices disposed on the second touch control electrode, wherein positions of the black matrices correspond to positions of the second touch control units. Since the black matrices correspond to the positions of the second touch control units, reflections to ambient light and reflections of metal electrodes to light can be effectively reduced, thereby improving the display effect.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display screen, comprising:
   a flexible substrate;
   a switch array layer disposed on the flexible substrate;
   an anode disposed on the switch array layer;
   a pixel definition layer disposed on the anode and comprising a plurality of opening areas;
   an organic light-emitting layer positioned in the opening areas;
   a cathode disposed on the organic light-emitting layer and the pixel definition layer, wherein the cathode is multiplexed as a first touch control electrode comprising a plurality of first touch control units;
   a second touch control electrode disposed on the cathode and comprising a plurality of second touch control units disposed at intervals; and
   a plurality of black matrices disposed on the second touch control electrode, wherein positions of the black matrices correspond to positions of the second touch control units.

2. The display screen according to claim 1, wherein under a top viewing angle, the display screen comprises a plurality of organic light-emitting units; and
   a shape of the second touch control units is a grid shape, the second touch control units comprise a plurality of touch control sensing lines interlaced with each other, and the touch control sensing lines correspond to positions of gaps between two adjacent organic light-emitting units.

3. The display screen according to claim 2, wherein the first touch control units and the second touch control units are disposed alternatingly.

4. The display screen according to claim 1, further comprising a color resist layer,
wherein the color resist layer is disposed between the cathode and the second touch control electrode, the color resist layer comprises a plurality of color filter resists, and positions of the color filter resists correspond to a position of the organic light-emitting layer.

5. The display screen according to claim 4, wherein the color filter resists are manufactured by inkjet printing.

6. The display screen according to claim 5, further comprising an encapsulation layer, wherein the color resist layer is disposed in the encapsulation layer.

7. The display screen according to claim 6, further comprising:
a first inorganic layer disposed between the cathode and the color resist layer;
an organic layer disposed on the color resist layer; and
a second inorganic layer disposed on the organic layer.

8. The display screen according to claim 1, further comprising a plurality of connecting lines, wherein the first touch control units are connected to a driver chip through the connecting lines, and the driver chip is used for providing driving voltages at a display stage and detecting touch control signals at a touch stage.

9. The display screen according to claim 1, wherein when the display screen is at a display stage, the cathode has a first function; and
when the display screen is at a touch stage, the cathode has a second function.

10. The display screen according to claim 1, wherein a material of the second touch control electrode is a metal material or a transparent conductive material.

11. An electronic device, comprising a display screen, wherein the display screen comprises:
a flexible substrate;
a switch array layer disposed on the flexible substrate;
an anode disposed on the switch array layer;
a pixel definition layer disposed on the anode and comprising a plurality of opening areas;
an organic light-emitting layer positioned in the opening areas;
a cathode disposed on the organic light-emitting layer and the pixel definition layer, wherein the cathode is multiplexed as a first touch control electrode comprising a plurality of first touch control units;

a second touch control electrode disposed on the cathode and comprising a plurality of second touch control units disposed at intervals; and
a plurality of black matrices disposed on the second touch control electrode, wherein positions of the black matrices correspond to positions of the second touch control units.

12. The electronic device according to claim 11, wherein under a top viewing angle, the display screen comprises a plurality of organic light-emitting units; and
a shape of the second touch control units is a grid shape, the second touch control units comprise a plurality of touch control sensing lines interlaced with each other, and the touch control sensing lines correspond to positions of gaps between two adjacent organic light-emitting units.

13. The electronic device according to claim 12, wherein the first touch control units and the second touch control units are disposed alternatingly.

14. The electronic device according to claim 11, further comprising a color resist layer,
wherein the color resist layer is disposed between the cathode and the second touch control electrode, the color resist layer comprises a plurality of color filter resists, and positions of the color filter resists correspond to a position of the organic light-emitting layer.

15. The electronic device according to claim 14, wherein the color filter resists are manufactured by inkjet printing.

16. The electronic device according to claim 15, wherein the display screen further comprises an encapsulation layer, and the color resist layer is disposed in the encapsulation layer.

17. The electronic device according to claim 16, further comprising:
a first inorganic layer disposed between the cathode and the color resist layer;
an organic layer disposed on the color resist layer; and
a second inorganic layer disposed on the organic layer.

18. The electronic device according to claim 11, wherein the display screen further comprises a plurality of connecting lines, the first touch control units are connected to a driver chip through the connecting lines, and the driver chip is used for providing driving voltages at a display stage and detecting touch control signals at a touch stage.

19. The electronic device according to claim 11, wherein when the display screen is at a display stage, the cathode has a first function; and
when the display screen is at a touch stage, the cathode has a second function.

* * * * *